(12) United States Patent
Yamashita

(10) Patent No.: US 10,527,235 B2
(45) Date of Patent: Jan. 7, 2020

(54) LIGHT EMITTING DEVICE

(71) Applicant: NICHIA CORPORATION, Anan-shi, Tokushima (JP)

(72) Inventor: Toshiaki Yamashita, Komatsushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/711,339

(22) Filed: Sep. 21, 2017

(65) Prior Publication Data
US 2018/0087726 A1 Mar. 29, 2018

(30) Foreign Application Priority Data

Sep. 26, 2016 (JP) ................. 2016-186717

(51) Int. Cl.
*F21K 9/64* (2016.01)
*F21V 13/04* (2006.01)
*F21V 29/505* (2015.01)
*F21V 29/70* (2015.01)
*F21V 9/30* (2018.01)
(Continued)

(52) U.S. Cl.
CPC ................. *F21K 9/64* (2016.08); *F21V 9/30* (2018.02); *F21V 13/04* (2013.01); *F21V 29/505* (2015.01); *F21V 29/70* (2015.01); *H01S 5/005* (2013.01); *H01S 5/02292* (2013.01); *F21V 5/04* (2013.01); *F21V 29/507* (2015.01); *F21Y 2115/10* (2016.08); *F21Y 2115/30* (2016.08);
(Continued)

(58) Field of Classification Search
CPC ...... F21V 9/30; F21V 9/35; F21K 9/64; F21K 9/30; F21Y 2115/30; H01S 5/005; H01S 5/02292; H01S 5/02208
See application file for complete search history.

(56) References Cited

U.S. PATENT DOCUMENTS

2006/0291246 A1 12/2006 Hattori et al.
2013/0193469 A1* 8/2013 Baade ................ C09K 11/0883
257/98
(Continued)

FOREIGN PATENT DOCUMENTS

| JP | 2007-005483 A | 1/2007 |
| JP | 2009-170723 A | 7/2009 |
| JP | 2013-254889 A | 12/2013 |

*Primary Examiner* — Zheng Song
(74) *Attorney, Agent, or Firm* — Global IP Counselors, LLP

(57) ABSTRACT

A light emitting device includes a support member, a semiconductor laser element, a light reflecting member, and a wavelength conversion member. The support member has a base and a cap that includes a light extraction window from which light is extracted upward. The semiconductor laser element is disposed within a space defined by the base and the cap. The light reflecting member is disposed in the space at a position where light from the semiconductor laser element is reflected toward the light extraction window. The wavelength conversion member is disposed between the semiconductor laser element and the light reflecting member, and includes a support surface that supports the light reflecting member, and a light incidence surface on which the light emitted by the semiconductor laser element is incident. Part of the wavelength conversion member is fitted into the light extraction window.

19 Claims, 3 Drawing Sheets

(51) Int. Cl.
  *H01S 5/00* (2006.01)
  *H01S 5/022* (2006.01)
  *F21Y 115/30* (2016.01)
  *G02B 5/04* (2006.01)
  *F21V 29/507* (2015.01)
  *F21V 5/04* (2006.01)
  *F21Y 115/10* (2016.01)
  *G02B 7/182* (2006.01)

(52) U.S. Cl.
  CPC ............... *G02B 5/04* (2013.01); *G02B 7/182* (2013.01); *H01S 5/02208* (2013.01)

(56) References Cited

U.S. PATENT DOCUMENTS

| | | | |
|---|---|---|---|
| 2013/0329397 A1 | 12/2013 | Shimizu et al. | |
| 2013/0329416 A1* | 12/2013 | Shimizu | F21S 2/00 362/230 |
| 2013/0329442 A1* | 12/2013 | Kishimoto | C09K 11/7774 362/510 |
| 2014/0268787 A1* | 9/2014 | Nozaki | H01S 3/005 362/259 |
| 2015/0062943 A1* | 3/2015 | Takahira | F21S 41/675 362/510 |
| 2015/0159820 A1* | 6/2015 | Lee | F21V 13/08 362/84 |
| 2015/0345728 A1* | 12/2015 | Tsuda | F21S 41/29 362/511 |
| 2017/0299142 A1* | 10/2017 | Park | F21K 9/64 |

\* cited by examiner

LIGHT EMITTING DEVICE

CROSS-REFERENCE TO RELATED PATENT APPLICATION

This application claims priority to Japanese Patent Application No. 2016-186717, filed Sep. 26, 2016. The entire disclosure of Japanese Patent Application No. 2016-186717 is hereby incorporated herein by reference.

BACKGROUND

1. Technical Field

The present disclosure relates to a light emitting device.

2. Description of the Related Art

With a light emitting device featuring a laser element, the number of laser elements used, the type of phosphor-containing member, the type and layout of other parts constituting the light emitting element, and so forth are suitably set according to the optical characteristics to be obtained. Also, a mode in which the laser element and the phosphor-containing member are disposed so that the laser light incidence surface and the surface on the light extraction side of the phosphor-containing member are different surfaces (such as the lower surface and the upper surface), a mode in which the laser element and the phosphor-containing member are disposed so that the laser light incidence surface and the surface on the light extraction side of the phosphor-containing member are the same surface (such as the upper surface), and so forth have been employed. For example, Japanese Patent Application Laid-open Nos. 2013-254889 and 2007-5483 discuss a light emitting device in which a side surface of the phosphor-containing member is used as the laser beam incidence surface, and the upper surface is used as the surface on the light extraction side.

SUMMARY

There is a need to further improve light extraction efficiency by making light emitted from a laser element incident on a phosphor-containing member and extracting this light more reliably, that is, by reducing light loss within the package.

It is an object of embodiments according to the present disclosure to provide a light emitting device with which light extraction efficiency can be further improved by having light emitted from a laser element be incident on a phosphor-containing member and taking off this light to the outside more reliably.

The present application includes the invention described below. A light emitting device includes a support member having a base and a cap, the cap including a light extraction window from which light is extracted upward; a semiconductor laser element disposed within a space defined by the base and the cap; a light reflecting member disposed in the space at a position where light from the semiconductor laser element is reflected toward the light extraction window; and a wavelength conversion member disposed between the semiconductor laser element and the light reflecting member, and including a support surface that supports the light reflecting member, and a light incidence surface on which the light emitted by the semiconductor laser element is incident. Part of the wavelength conversion member is fitted into the light extraction window.

Accordingly, the present disclosure can provide a light emitting device with which light extraction efficiency can be further improved.

DETAILED DESCRIPTION

Figure 1A:
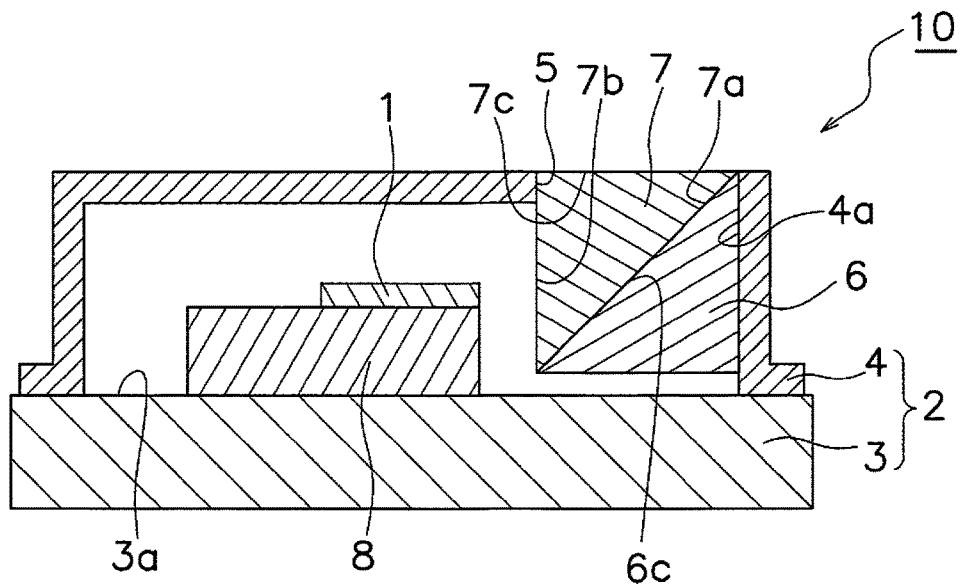
FIG. 1A is a schematic cross section of a light emitting device according to Embodiment 1.

The embodiments shown below are intended as illustrative to give a concrete form to technical ideas of the present invention, and the scope of the invention is not limited to those described below. Also, the sizes and the positional relationship of the members described in the drawings may be exaggerated for the sake of clarity. Further, the same designations or the same reference numerals denote the same or alike members and duplicative descriptions will be appropriately omitted.

Light Emitting Device

As shown in FIG. 1A, a light emitting device 10 contains a semiconductor laser element 1 and a support member 2 that has a base 3 and a cap 4. The semiconductor laser element 1 is disposed within a space defined by the base 3 and the cap 4 and emits light, such as laser light. A light extraction window 5 from which light is extracted is provided to the cap 4. A light reflecting member 6 and a wavelength conversion member 7 are housed in the space defined by the support member 2. The light reflecting member 6 is disposed at a location where light from the semiconductor laser element 1 can be reflected toward the light extraction window 5. The wavelength conversion member 7 is disposed between the semiconductor laser element 1 and the light reflecting member 6. The wavelength conversion member 7 includes a support surface 7a that supports the light reflecting member 6, and a light incidence surface 7b that is a different surface from the support surface 7a and on which the laser light emitted by the semiconductor laser element 1 is incident, and part of the wavelength conversion member 7 is fitted to the light extraction window 5. With this light emitting device 10, the light extraction window 5 is provided at a site corresponding to the upper part of the space defined by the base 3 and the cap 4, and the side of the support member 2 on which the light extraction window 5 is disposed corresponds to the light extraction surface side. This configuration allows the light emitted from the light extraction surface side of the wavelength conversion member 7 to be extracted to the outside of the space defined by the support member 2 without going through said space. Consequently, after the light emitted from the semiconductor laser element 1 has been incident on the wavelength conversion member 7, that light can be more reliably extracted to the outside by utilizing the light reflecting member 6. Therefore, the efficiency of the light extraction can be further improved. Also, the risk of reduced heat dissipation efficiency or increased heat generation in the wavelength conversion member 7 in the case where the wavelength conversion member 7 is too close to the semiconductor laser element 1 can be lessened by heat dissipation of the wavelength conversion member 7 from the cap 4. Therefore, it is possible to dispose the wavelength conversion member 7 near the semiconductor laser element 1 as needed. Also, in the case where the wavelength conversion member 7 is disposed near the semiconductor laser element 1, there is no need for a light collecting member such as a converging lens, so the number of parts constituting the light emitting device 10 can be reduced, and the support member 2 can be made smaller. This makes it possible to make the light emitting device 10 itself simpler and more compact, and to reduce manufacturing costs. In this Specification, the direction from the light reflecting member 6 toward the light extraction window 5 shall be referred to as upward.

Support Member 2

The support member 2 is made up of the base 3 and the cap 4. The base 3 is mainly for mounting the semiconductor laser element 1. The base 3 can be made of a material having suitable strength and thermal conductivity. Examples of such a material include copper, copper alloys, iron, iron alloys such as KOVAR®, or other such metals, as well as ceramics including aluminum nitride or aluminum oxide. The base 3 may have any of various shapes, such as a board shape, or a shape having a concave portion that opens upward. In particular, in order to facilitate control of the optical path of light emitted from the semiconductor laser element 1, it is preferable for the surface on which the semiconductor laser element 1 is mounted (hereinafter also referred to as the "upper surface") to be flat, and a shape having an upper surface and a lower surface that are parallel to each other is preferable. Examples of the planar shape of the base 3 include substantially circular, substantially elliptical, substantially polygonal, and various other shapes. The size of the base 3 can be suitably adjusted, but the base 3 has, for example, an area of at least 10 mm$^2$ in the plan view, namely as viewed in a direction perpendicular to an upper surface 3a of the base 3. In the case where just one semiconductor laser element 1 is mounted in the light emitting device 10, it is possible to reduce the area of the base 3, and more specifically it can be 35 mm$^2$ or less. When strength, heat dissipation and the like are taken into account, the thickness of the base 3 is at least 0.2 mm, and preferably 0.2 to 1.0 mm. The base 3 can have a constant thickness over the entire region, or its thickness can vary from one place to another. In the case where the base 3 has a shape with a concave portion that opens upward, an example of the height thereof is 500 to 3000 μm, and preferably 800 to 2000 μm. The base 3 may have a section with a shape such as a protrusion or a bend, for fixing the cap 4 (discussed below), etc.

The cap 4 is mainly used for giving the semiconductor laser element 1 a hermetic seal integrally with the wavelength conversion member 7, etc. The cap 4 can be made of a material having suitable strength and thermal conductivity. Examples of such materials include copper, copper alloys, iron, iron alloys such as KOVAR®, or other such metals, as well as ceramics including aluminum nitride or aluminum oxide. The cap 4 may be formed from the same material as the base 3, or may be formed from a different material. The cap 4 is usually joined to the base 3 by using a eutectic material or the like or by welding. The shape of the cap 4 may be any of various shapes such as, a board shape or a shape having a concave portion that opens downward, and is a shape with which the space that houses the semiconductor laser element 1 etc. can be defined by engagement with the base 3. For instance, as shown in FIG. 1A, in the case where the base 3 has a board-like shape having upper and lower surfaces parallel to each other, an example of the shape of the cap 4 is one with a concave part that opens downward and has a ceiling part located above the semiconductor laser element 1, etc., mounted on the base 3 and side wall parts that support the ceiling part. Also, the cap 4 may have a section with a shape such as a protrusion or a bend, for fixing the cap 4 on the base 3. When the cap 4 has a shape with a concave part that opens downward, an example of the height thereof is 500 to 3000 μm, and preferably 800 to 2000 μm. When strength, heat dissipation, and so forth are taken into account, the thickness of the cap 4 is at least 0.2 mm, and preferably 0.2 to 1.0 mm.

Figure 1B:
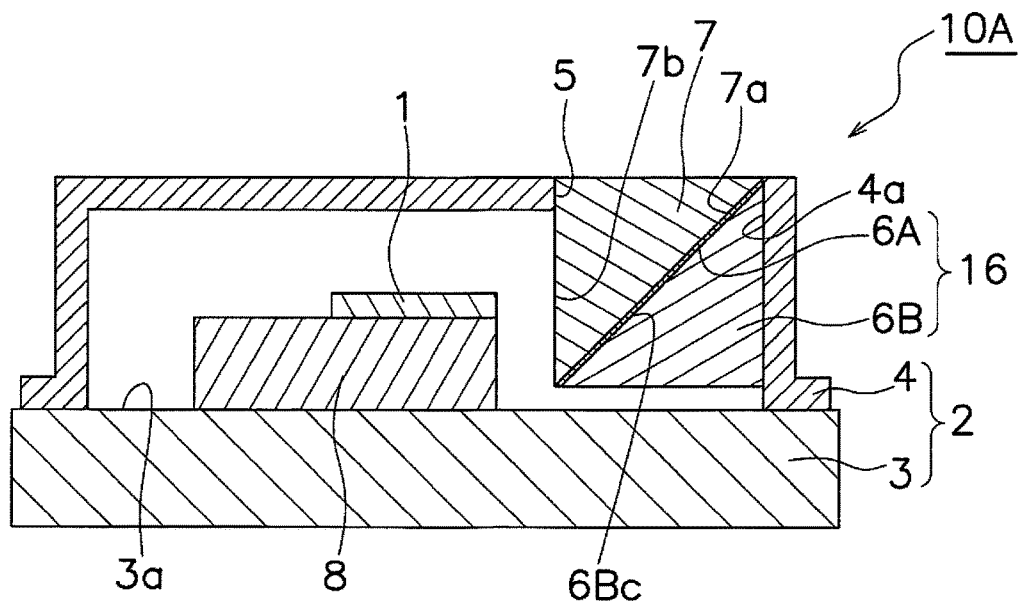
FIG. 1B is a schematic cross section of a modification embodiment of the light emitting device in FIG. 1A.
Figure 1C:
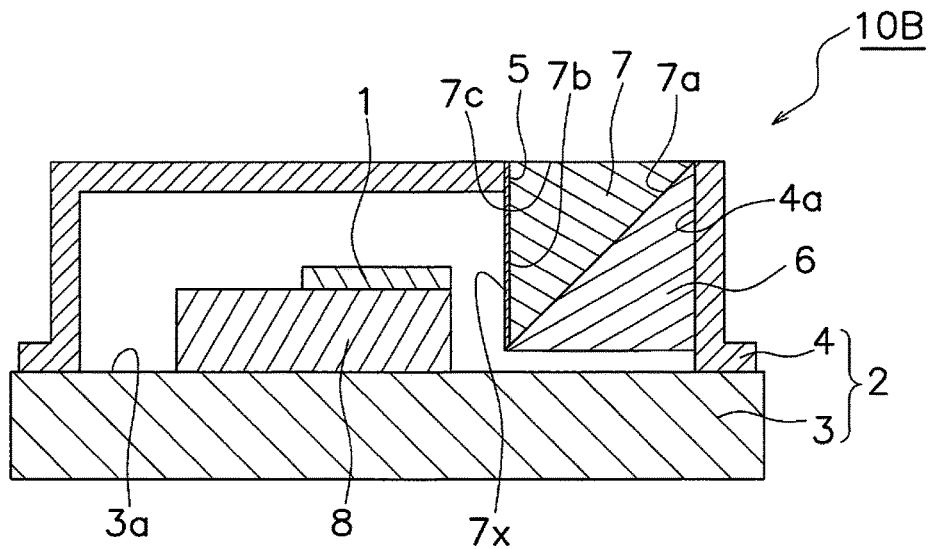
FIG. 1C is a schematic cross section of another modification embodiment of the light emitting device in FIG. 1A.

The cap 4 has a light extraction window 5 for extracting light. The light extraction window 5 is a through-hole in the cap 4. The light extraction window 5 is disposed at a position opposite the upper surface 3a of the base 3 on which the semiconductor laser element 1 is mounted. In other words, the position of the light extraction window 5 is disposed on the ceiling part of the cap 4 located above the semiconductor laser element 1 mounted on the base 3. It is preferable that part of the light extraction window 5 be disposed at a position adjacent to the outer periphery of the cap 4 as viewed from the upper surface of the cap 4 (FIGS. 1A to 1C, etc.). Consequently, the light reflecting member 6 disposed in the light extraction window 5 can also be fixed to the side wall parts of the cap 4. Also, as viewed from the upper surface of the cap 4, the light extraction window 5 may be entirely separated from the position adjacent to the outer periphery of the cap 4 (FIG. 1D), and may be disposed in the central portion, for example. The size of the light extraction window 5 should be large enough to allow light emitted from the semiconductor laser element 1 to pass through. Taking into account light that passes through the wavelength conversion member 7 (discussed below), etc., and is reflected by the light reflecting member 6, the size of the light extraction window 5 can be from 0.3 to 9 mm$^2$, with 0.5 to 4 mm$^2$ being preferable. The size of the light extraction window 5 can be 5 to 20 times as large as the spot diameter of the laser light emitted by the semiconductor laser element 1 on the light incidence surface 7b of the wavelength conversion member 7, and preferably 5 to 10 times. Thus setting the size, etc., allows substantially all of the light emitted from the semiconductor laser element 1 to be extracted from the light extraction surface side via the wavelength conversion member 7 or the like. The shape of the light extraction window 5 may be any of various shapes, such as a rectangle or other such polygon, a circle, or an ellipse. The light extraction window 5 preferably has a rectangular or other such polygonal shape, since that is suited to the easy formation of a quadrangular prism or other such polygonal prism shape as the combined shape of the wavelength conversion member 7 and the light reflecting member 6, as described later.

Semiconductor Laser Element 1

The semiconductor laser element 1 is mounted on the base 3 in a space defined by the base 3 and the cap 4. Just one semiconductor laser element 1 may be disposed in a single light emitting device 10, or a plurality of semiconductor laser elements 1 may be disposed. An example of the semiconductor laser element 1 is a semiconductor laser element having a semiconductor layer such as a nitride semiconductor (mainly expressed by the general formula In$_x$Al$_y$Ga$_{1-x-y}$N, where 0≤x, 0≤y, and x+y≤1). The composition, etc., can be adjusted to adjust the oscillation wavelength of the semiconductor laser element 1. For instance, a semiconductor laser element 1 having an oscillation wavelength in the range of 400 to 530 nm can be used. In the case where this is combined with a YAG-based phosphor, for example, the light extracted from the light emitting device 10 can be made white by color mixing, therefore a semiconductor laser element 1 with an oscillation wavelength in the range of 420 to 490 nm is preferable.

The semiconductor laser element 1 is preferably disposed so that the light emitting end surface of the laser light is substantially perpendicular to the upper surface 3a of the base 3. Such an arrangement avoids a situation in which the laser light is directly oscillated toward the outside due to the position of the cap 4. The semiconductor laser element 1 may be disposed directly on the upper surface 3a of the base 3, but it is preferable to dispose it on an upper surface of a sub-mount 8 that is disposed between the semiconductor laser element 1 and the upper surface 3a. This allows the light emitting end surface of the semiconductor laser element 1 to be separated from the upper surface 3a of the base 3, and therefore prevents light from the semiconductor laser element 1 from striking the upper surface 3a of the base 3. Also, the sub-mount 8 can be used to improve heat dissipation. The sub-mount 8 can be formed from aluminum nitride, silicon carbide, or the like, for example. In the case where the sub-mount 8 is provided, it is still preferable for the semiconductor laser element 1 be mounted so that the emitted light will travel in a direction substantially parallel to the upper surface 3a of the base 3.

Light Reflecting Member 6

The light reflecting member 6 is disposed along the optical path of the light emitted from the semiconductor laser element 1, and is disposed at a position where it reflects this light toward the above-mentioned light extraction window 5 of the cap 4. The light reflecting member 6 is, for example, a member (6 in FIG. 1A) with a shape having an inclined surface (6c in FIG. 1A), such as a triangular prism, a quadrangular prism, a truncated triangular pyramidal, a truncated square pyramidal, or the like, or has a member (6B in FIG. 1B) with one of these shapes and a reflective film (6A in FIG. 1B) provided on at least one surface, or the like. Examples of members with a shape having an inclined surface (6c in FIG. 1A, 6Bc in FIG. 1B) include those made of metal, ceramics, glass, and composites of these. The inclined surface (6c in FIG. 1A) of the light reflecting member 6 or a surface of the reflective film (6A in FIG. 1B) is a reflective surface of the light reflecting member. The reflective surface that reflects light from the semiconductor laser element 1 preferably has a reflectance of at least 80% with respect to the light emitted from the semiconductor laser element 1, and more preferably reflects at least 90%. The reflective film 6A can be formed by a dielectric multilayer film, a metal film, or a laminated film of these. The side of the light reflecting member 6 provided with the reflective film 6A can be disposed at a position intersecting the optical axis of the laser light emitted from the semiconductor laser element 1 at 30 to 60 degrees, and is typically disposed at a position intersecting at about 45 degrees. This allows the light hitting one side of the light reflecting member 6 to be efficiently reflected upward. That is, since the reflected light can be directed at the light extraction window 5 of the cap 4, the light can be efficiently extracted to the outside of the support member 2.

The light reflecting member 6 may be separated from the inner side surface (the side surface 4Ca of the cap 4C) of the support member 2 (2C) linked to the upper surface 3a of the base 3 (see FIG. 1D), that is, the mounting surface of the support member 2 on which the semiconductor laser element 1 is mounted. However, it is preferably in contact with the inner side surface (the side surface 4a of the cap 4) of the support member 2 (see FIGS. 1A to 1C). In this case, the light reflecting member 6 may or may not be in contact with the mounting surface of the support member 2 on which the semiconductor laser element 1 is mounted, that is, the upper surface 3a of the base 3 of the support member 2. Bringing the light reflecting member 6 into contact with the side surface 4a of the support member 2 allows heat to be drawn from this surface, which improves heat dissipation.

Wavelength Conversion Member 7

The wavelength conversion member 7 is disposed between the semiconductor laser element 1 and the light reflecting member 6. The wavelength conversion member 7 has a support surface 7a for supporting the light reflecting member 6 and a light incidence surface 7b on which the laser light emitted from the semiconductor laser element 1 is incident, which is not the same surface as the support surface 7a. The light incidence surface 7b can be disposed substantially perpendicular to the optical axis of the incident laser light. This makes it less likely that the laser light will be reflected by the light incidence surface 7b. The wavelength conversion member 7 also has a light emitting surface 7c at which the wavelength of the incident light is converted before the light is emitted.

The wavelength conversion member 7 includes a phosphor. The wavelength conversion member 7 may be formed by a phosphor alone, or in addition to the phosphor it may include a material that is transmissive to both the light from the semiconductor laser element 1 and fluorescent light from the phosphor. For example, a single crystal of a phosphor, a sintered phosphor, or a sinter of a phosphor and a ceramic or the like may be used. The wavelength conversion member 7 can be formed from a single material or a plurality of materials, and a single-layer structure or a laminated structure can be employed. This allows the wavelength of the light emitted from the semiconductor laser element 1 to be converted, and allows mixed color light that is a mixture of the light from the semiconductor laser element 1 and the wavelength-converted light to be released to the outside.

The phosphor can be selected, for example, by taking into account the wavelength of the emitted light of the semiconductor laser element 1 being used, the color of light to be obtained, and other such factors. More specifically, examples include cerium-activated yttrium aluminum garnet (YAG), cerium-activated lutetium aluminum garnet (LAG), and europium- and/or chromium-activated nitrogen-containing calcium aluminosilicate (CASN) and the like. Among these, it is preferable to use a YAG phosphor with excellent heat resistance. A plurality of kinds of phosphors may be used in combination. For example, color rendering properties and color reproducibility can be adjusted by using phosphors of different emission colors in combinations or blending ratios suited to the desired color. When using two or more types of phosphor, a wavelength conversion member 7 having a single-layer structure may contain two or more types of phosphor, or different kinds of phosphors may be contained in different layers in a wavelength conversion member 7 with a laminated structure. Single crystal phosphors are less likely to scatter light than wavelength conversion members containing ceramics. Therefore, light extraction efficiency can be improved by using a single crystal phosphor as the wavelength conversion member 7.

An example of a ceramic is aluminum oxide ($Al_2O_3$, melting point: approximately 1900 to 2100° C.), barium oxide (BaO, melting point: 1800 to 2000° C.), and yttrium oxide ($Y_2O_3$, melting point: 2425° C.). These may be used alone or in combinations of two or more types. Among these, those containing aluminum oxide are preferred because of good transparence and good melting point, thermal conductivity, diffusibility, and so on. In the case where the wavelength conversion member 7 is formed from a mixture of a phosphor and a ceramic or the like, the proportion of the phosphor may be 50 wt % or less with respect to the total weight of the wavelength conversion member 7, can be 30 wt % or less, and is preferably at least 1 wt %. Also, the wavelength conversion member 7 is preferably formed from a material having good light resistance and heat resistance, making it less prone to modification or the like when irradiated with high-output light. An example is a material with a melting point of 1000 to 3000° C., preferably 1300 to 2500° C., and more preferably, 1700 to 2200° C. By forming the wavelength conversion member 7 from a material such as the above, even if the wavelength conversion member 7 becomes hot due to the high output of the semiconductor laser element 1, melting of the wavelength conversion member 7 itself can be suppressed, which in turn makes deformation and discoloration of the wavelength conversion member 7 less likely to occur. Thus, the rate of deterioration of the optical characteristics can be reduced, and the optical output within the specified range can be maintained for an extended period. Also, using a material having excellent thermal conductivity as the material of the wavelength conversion member 7 allows the heat generated by the phosphor when irradiated with the laser light to be efficiently released. Consequently, the rate of degradation of the phosphor can be reduced, and the light output within the specified range can be maintained for an extended period.

The shape of the entire wavelength conversion member 7 can be set as desired, as long as the shape allows part of the wavelength conversion member 7 to be fitted into the light extraction window 5. For example, the planar shape of the wavelength conversion member 7 on the light extraction window 5 side is preferably the same as that of the light extraction window 5. The overall shape of the wavelength conversion member 7 is a shape having an inclined surface, such as a triangular prism, a quadrangular prism, a truncated triangular pyramidal, or a truncated quadrangular pyramidal, and particularly a shape having a surface that allows one side of the light reflecting member 6 to be supported and fitted. The wavelength conversion member 7 preferably supports the light reflecting member 6 and is integrated with the light reflecting member 6 in the form of a polygonal prism or a truncated polygonal pyramid, with a cube or parallelepiped being even better. In this way, by making the wavelength conversion member 7 and the light reflecting member 6 have shapes that have surfaces opposite and parallel to each other, it is possible to stably and freely fix them to the support member 2. The wavelength conversion member 7 and the cap 4 can be fixed using an adhesive material such as a low-melting point glass. The wavelength conversion member 7 may be any size as long as the light from the semiconductor laser element 1 passing through it can be converted to the proper wavelength. For example, a columnar or truncated cone-shaped member, at its maximum, with the planar size of the light extraction window 5 is preferable. The laser light emitted from the semiconductor laser element 1 is scattered by the phosphor or the like when it is incident on the wavelength conversion member 7, so there is a tendency for it to be unaligned light rather than a laser beam. Accordingly, the light from the semiconductor laser element 1 is not limited to being laser light.

The support surface 7a that supports the light reflecting member 6 on the wavelength conversion member 7 is preferably connected to the light reflecting member 6 over its entire surface. This ensures a path for the heat generated by the wavelength conversion member 7 to be released through the light reflecting member 6.

An antireflective layer (AR layer; 39 in FIG. 3), a short wavelength pass filter (SWPF, 7x in FIG. 1C and 35 in FIG. 3), a diffusion layer, or another such functional film may be formed as needed on the light incidence surface 7b and/or the light emitting surface 7c of the wavelength conversion member 7. Also, a transmissive member (29 in FIG. 2) such as sapphire may be disposed on the light incidence side and/or the light emitting side of the wavelength conversion member 7. The transmissive member here should be one that transmits the light from the wavelength conversion member 7, and preferably one that transmits at least 70% of this light, and more preferably at least 80%, with 90% or more being even better. The transmissive member can be formed, for example, from glass, sapphire, or the like.

As shown in FIG. 1A, the wavelength conversion member 7 is preferably not in contact with the mounting surface of the support member 2 on which the semiconductor laser element 1 is mounted. In other words, the wavelength conversion member 7 is preferably not in contact with the upper surface 3a of the base 3. This allows the path of heat from the wavelength conversion member 7 to the semiconductor laser element 1 to be longer than the cases where there is contact, so the influence of heat generated by the wavelength conversion member 7 on the semiconductor laser element 1 can be reduced. Therefore, the wavelength conversion member 7 can be disposed closer to the semiconductor laser element 1. For the same reason, the light reflecting member 6 is also preferably not in contact with the mounting surface of the support member 2 for the semiconductor laser element 1. In other words, the light reflecting member 6 is also preferably not in contact with the upper surface 3a of the base 3. The shortest distance between the light incidence surface 7b of the wavelength conversion member 7 and the light emitting end surface of the semiconductor laser element 1 is preferably 700 μm or less. Consequently, most of the laser light emitted from the semiconductor laser element 1 can reach the light incidence surface 7b of the wavelength conversion member 7 without the use of a converging lens or other such optical member. Also, the light incidence surface 7b is preferably separated from the light emitting end surface far enough that the heat of the light emitting end surface of the semiconductor laser element 1 is not easily transmitted. More specifically, it is preferably separated by at least 300 μm. Part of the wavelength conversion member 7 is fitted to the light extraction window 5 formed in the cap 4. That is, the wavelength conversion member 7 is preferably disposed so as to block the light extraction window 5, either by itself or together with the light reflecting member 6. With a shape such as this, the light incident on the wavelength conversion member 7 can be more reliably extracted to the light extraction surface side from the light extraction window 5, without being reflected or absorbed by the walls inside the support member 2, by utilizing the light reflecting member 6. Also, the heat generated by the wavelength conversion member 7 can be transmitted through the light extraction window 5 to the cap 4 and the base 3, etc., and can be released from the surface of the support member 2, resulting in good heat dissipation. Consequently, the wavelength conversion member 7 can be disposed closer to the semiconductor laser element 1. In this case, heat dissipation can be further improved by connecting a heat dissipating member to the cap 4 and/or the base 3. In the case where the wavelength conversion member 7 is fitted to the light extraction window 5, it is preferable that the upper surface of the cap 4 be flush with the upper surface (the light emitting surface 7c) of the wavelength conversion member 7 inside the light extraction window 5, that is, the upper surface of the wavelength conversion member 7 being at the same height as the upper end of the light extraction window 5. The upper end of the light extraction window 5 is defined by an edge of the upper surface of the cap 4, and the height of the upper end of the light extraction window 5 may be correspond to the height of the edge of the upper surface of the cap 4. This prevents the light emitted from the light emitting surface 7c of the wavelength conversion member 7 from being absorbed by the inner walls of the light extraction window 5, and since light is extracted only from the light emitting surface 7c of the wavelength conversion member 7, a high luminance can be attained. On the other hand, to facilitate formation, the upper surface of the wavelength conversion member 7 can be lower or higher than the upper end of the light extraction window 5. In this case, the distance in the up and down direction between the upper surface of the wavelength conversion member 7 and the upper end of the light extraction window 5 is preferably 0.3 mm or less.

The wavelength conversion member 7 is fitted to the light extraction window 5 and is pressed snugly against the cap 4 (see FIGS. 1A to 1C). Furthermore, a transmissive member 29 that covers the light extraction window 5 may be fixed to the support member 2, and one side of the wavelength conversion member 7, that is, the upper surface, may be fixed to this transmissive member 29 (see FIG. 2). This allows heat to radiate from one side of the wavelength conversion member 7 to the transmissive member 29 as well. The thickness of the transmissive member 29 is, for example, 100 to 2000 μm.

Embodiment 1

As shown in FIG. 1A, the light emitting device 10 of Embodiment 1 contains the semiconductor laser element 1 and the support member 2 having the base 3 and the cap 4. The base 3 is substantially in the form of a flat board, and the cap 4 has a shape with a bottom and an open surface, with a space being defined by the opposition of the two. The semiconductor laser element 1 is disposed on the upper surface 3a of the base 3 via a sub-mount 8, within the space defined by the base 3 and the cap 4. The base 3 and the cap 4 are each formed of KOVAR®. The light extraction window 5, which is used for extracting light to a position adjacent to the outer periphery of the cap 4, is provided in the cap 4 in a rectangular shape measuring 1×0.5 mm in top view, for example. The base 3 and the cap 4 are joined by welding, which gives the semiconductor laser element 1 a hermetic seal. The light reflecting member 6 and the wavelength conversion member 7 are housed in the space defined by the support member 2. The light reflecting member 6 is disposed with its reflecting surface, which has an angle of 45 degrees, facing the optical path of the light emitted from the semiconductor laser element 1, at a position where the light from the semiconductor laser element 1 can be reflected toward the light extraction window 5. The light reflecting member 6 is in the form of a triangular prism. With this triangular prism shape, the two bottom surfaces are isosceles triangles, and the rectangular surfaces constituting the side surfaces of the triangular prism are the surfaces that reflect light from the semiconductor laser element 1. The light reflecting member 6 is itself made from a material with good reflectivity, and is formed from aluminum. The light reflecting member 6 is disposed so that one entire surface is pressed snugly against the side surface 4a of the cap 4 on a different side from the side where the light is incident. The lower surface of the light reflecting member 6 is disposed away from the upper surface 3a of the base 3.

The wavelength conversion member 7 is disposed between the semiconductor laser element 1 and the light reflecting member 6, and includes a support surface 7a that supports the light reflecting member 6, a light incidence surface 7b on which is incident the laser light emitted by the semiconductor laser element 1 and which is not the same surface as the support surface 7a, and a light emitting surface 7c from which light is emitted. The wavelength conversion member 7 is in the form of a triangular prism in which two opposing surfaces form an isosceles triangle and which is substantially the same size as the light reflecting member 6. The three side surfaces of this triangular prism are the support surface 7a, the light incidence surface 7b, and the light emitting surface 7c. The wavelength conversion member 7 is pressed snugly against the light reflecting member 6 at the support surface 7a, and the wavelength conversion member 7 and the light reflecting member 6 together constitute a quadrangular prism, part of which is fitted and fixed to the light extraction window 5. The light emitting surface 7c of the wavelength conversion member 7 is flush with the upper surface of the cap 4. The wavelength conversion member 7 is disposed away from the upper surface 3a of the base 3. The wavelength conversion member 7 is a sinter of a phosphor and aluminum oxide (melting point: approximately 1900 to 2100° C.). YAG is used as the phosphor, and this YAG is contained in an amount of 3 wt % with respect to the total weight of the wavelength conversion member 7.

Because of this configuration, light emitted from the semiconductor laser element 1 is incident on the wavelength conversion member 7, and this light can be extracted more reliably by using the light reflecting member 6, so the light extraction efficiency can be further improved. Also, concern over heat generation and dissipation at the wavelength conversion member 7 in the case where the wavelength conversion member 7 is too close to the semiconductor laser element 1 can be alleviated by drawing off the heat of the wavelength conversion member 7 from the cap 4. This allows the wavelength conversion member 7 to be disposed closer to the semiconductor laser element 1. Also, disposing the wavelength conversion member 7 closer to the semiconductor laser element 1 means that a converging member such as a converging lens can be eliminated, making it possible to reduce the number of components constituting the light emitting device 10 and allowing the support member 2 to be smaller in size. This allows the light emitting device 10 itself to be smaller and simpler, and reduces the manufacturing costs.

Modification Example 1 of Embodiment 1

As shown in FIG. 1B, the light emitting device 10A in this embodiment is configured substantially the same as the light emitting device 10, except that a light reflecting member 16 is a member that includes a member 6B and a reflective film 6A formed on one side thereof. The reflective film 6A has a silver layer and a dielectric multilayer film that are laminated in that order from the member 6B side. The member 6B is in the form of a triangular prism in which the two bottom surfaces form an isosceles triangle, and is formed from copper, which is a material whose reflectivity is lower than that of the reflective film 6A. The reflective film 6A is formed on the side surfaces of the triangular prism of the member 6B. Be making the light reflecting member 16 to be configured such that the reflecting film 6A is formed on the surface of the member 6B, the material of the member 6B can be selected by emphasizing thermal conductivity rather than reflectivity, as with copper, for example. Therefore, with the light emitting device 10A, in addition to the same effects as the light emitting device 10, heat generated by the wavelength conversion member 7 can be favorably drawn off through the member 6B.

Modification Example 2 of Embodiment 1

As shown in FIG. 1C, the light emitting device 10B in this embodiment is configured substantially the same as the light emitting device 10, except that a short wavelength pass filter 7x composed of dielectric multilayer film, in which a plurality of $SiO_2$ films and $Nb_2O_5$ films are laminated, is disposed on the light incidence surface 7b of the wavelength conversion member 7. The short wavelength pass filter 7x has a reflectivity at the emission wavelength of the semiconductor laser element 1 that is lower than the reflectivity at the wavelength of the wavelength-converted light of the wavelength conversion member 7. This allows the wavelength-converted light that attempts to go from the wavelength conversion member 7 to the semiconductor laser element 1 side to be reflected by the short wavelength pass filter 7x. Therefore, the light emitting device 10B has, in addition to the same effects as the light emitting device 10, the effect that the loss of light in the interior of the light emission device 10B can be further be reduced. Since the reflectivity of the short wavelength pass filter 7x can be given angle dependency, it is preferable for the reflectivity for the wavelength of laser light to be low within the angle range including the incidence angle of the laser light to the wavelength conversion member 7, and to be higher than this in any other angle range. This allows the light that attempts to return from the wavelength conversion member 7 to the semiconductor laser element 1 side to be reflected by the short wavelength pass filter 7x, and further reduces the loss of light in the interior of the light emitting device 10B.

Modification Example 3 of Embodiment 1

Figure 1D:
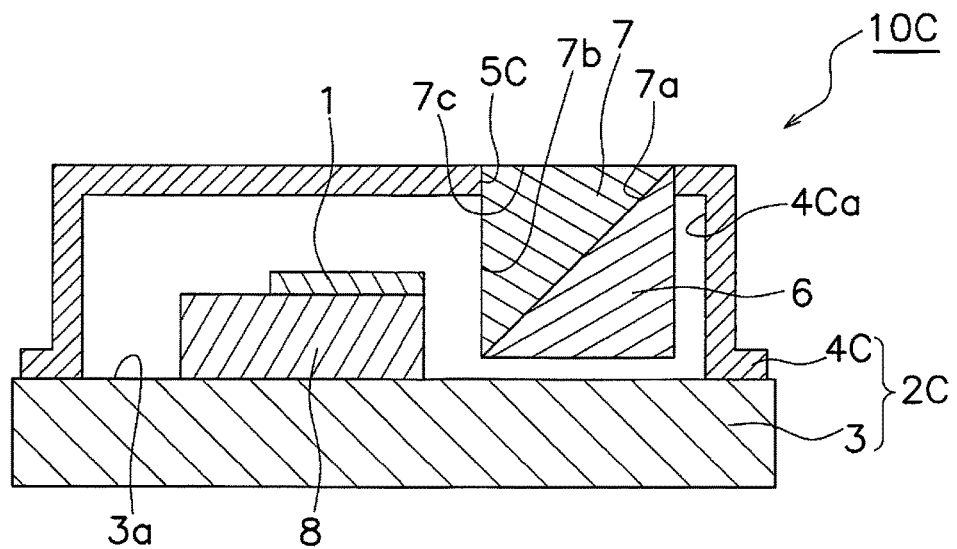
FIG. 1D is a schematic cross section of yet another modification embodiment of the light emitting device in FIG. 1A.

As shown in FIG. 1D, the light emitting device 10C in this embodiment is configured substantially the same as the light emitting device 10, except that in a cap 4C, a light extraction window 5C is disposed away from a side surface 4Ca of the cap 4C, so that one side of the light reflecting member 6 is not pressed snugly against the side surface 4Ca of the cap 4C. With this configuration, the heat dissipation path of the light reflecting member 6 is reduced as compared with the light emitting device 10, but it is easier to form the light extraction window 5C in the cap 4C.

Embodiment 2

Figure 2:
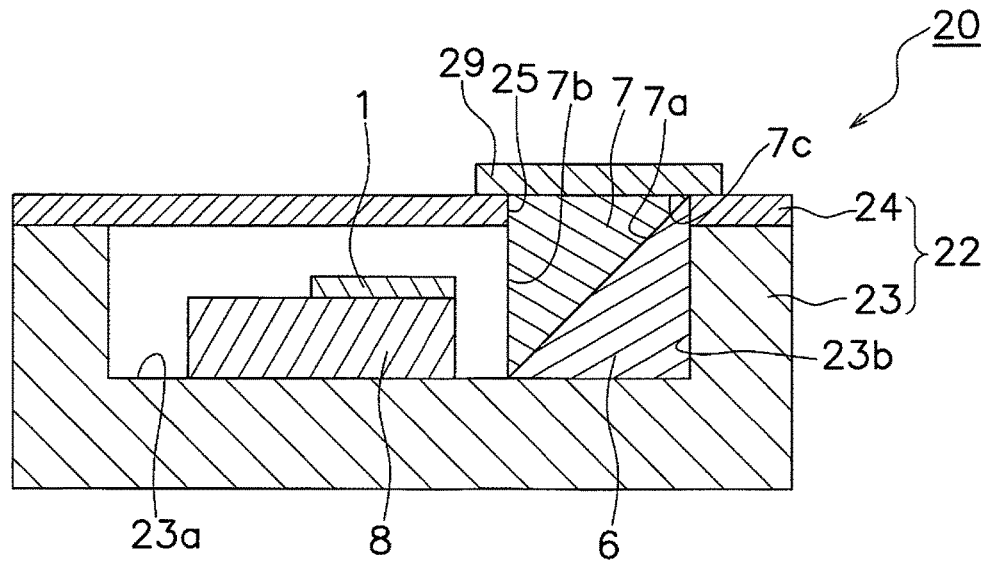
FIG. 2 is a schematic cross section of a light emitting device according to Embodiment 2.

As shown in FIG. 2, the light emitting device 20 in this embodiment contains the semiconductor laser element 1 and a support member 22 having a base 23 and a cap 24. The base 23 is box-shaped, having a bottom and an open surface. The cap 24 is substantially in the form of flat board, and a space is defined by the opposition of the two. The semiconductor laser element 1 is disposed within the space defined by the base 23 and the cap 24, via the sub-mount 8 on the bottom surface 23a of a recess in the base 23. The wavelength conversion member 7 and the light reflecting member 6 housed in the space defined by the support member 22 are together fitted to a light extraction window 25 of the cap 24. The light reflecting member 6 is disposed on a different side from the side where light is incident, with one entire side pressed snugly against a wall 23b of the recess in the base 23, and an entire other side that is adjacent to the one entire side is pressed snugly against the bottom surface 23a of the base 23. One side of the wavelength conversion member 7 is flush with the upper surface of the cap 24. The transmissive member 29 is disposed from the upper surface of the wavelength conversion member 7 to the upper surface of the cap 24, and one side of the wavelength conversion member 7 is pressed snugly against the transmissive member 29. The transmissive member 29 is formed from sapphire in a thickness of 500 μm. The transmissive member 29 and the cap 24 are bonded with low-melting point glass. They may also be bonded with a eutectic material such as AuSn.

Because of this configuration, in addition to the same effects as the light emitting device 10 described above, since the wavelength conversion member 7 is pressed snugly against the transmissive member 29, the drawing off of heat from the wavelength conversion member 7 can be executed by a different path (namely, the cap 24 and the transmissive member 29 side) from that of the heat draw-off with the semiconductor laser element 1 (that is, the base 23 side). Consequently, the wavelength conversion member 7 can be disposed closer to the semiconductor laser element 1. Also, even though there is a gap between the cap 24 and the light reflecting member 6 and wavelength conversion member 7, since this gap is covered by the transmissive member 29 from above, the hermetic seal of the light emitting device 20 can be improved.

Embodiment 3

Figure 3:
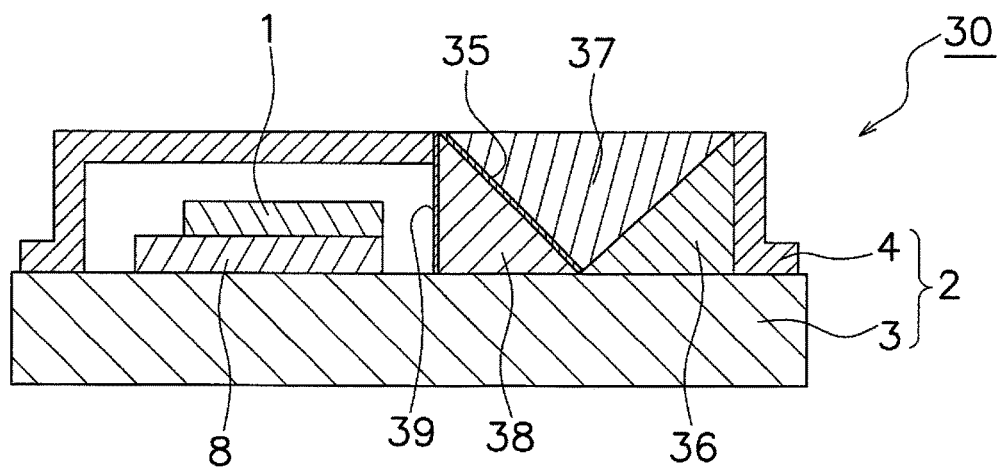
FIG. 3 is a schematic cross section of a light emitting device according to Embodiment 3.

As shown in FIG. 3, with the light emitting device 30 in this embodiment, a light reflecting member 36 is in the form of a triangular prism in which the two opposing surfaces form an isosceles triangle. A wavelength conversion member 37 is in the form of a triangular prism in which the two opposing surfaces form an isosceles triangle, and is slightly larger than the light reflecting member 36. One side surface of the triangular prism of the wavelength conversion member 37 is joined to one side surface of the triangular prism of the light reflecting member 36, and the two other side surfaces of the triangular prism of the wavelength conversion member 37 respectively serve as the surface on which light from the semiconductor laser element 1 is incident, and the light emitting surface faced to the outside of the light emitting device 30. A short wavelength pass filter 35 consisting of a dielectric multilayer film in which such as a plurality of $SiO_2$ films and $Nb_2O_5$ films are laminated, is disposed on the surface of the wavelength conversion member 37 on the light incidence side. Also, a transparent member 38 is disposed via the short wavelength pass filter 35 on the surface of the wavelength conversion member 37 on the light emitting side. The shape and size of the transparent member 38 are the same as those of the light reflecting member 36. An antireflective film 39 composed of a dielectric multilayer film in which a plurality of $SiO_2$ films and $Nb_2O_5$ films are laminated, is disposed on the surface of the transparent member 38 on the light incidence side. The antireflective film 39 reduces the reflectivity for the emitted light of the semiconductor laser element 1, so the loss of light inside the light emitting device 30 can be further reduced. The transparent member 38 is pressed snugly against the light incidence side of the wavelength conversion member 37, and the light reflecting member 36 against the opposite side, and these are fitted to the light extraction window of the cap 4 of the support member 2. One side of the light reflecting member 36 and one side of the transparent member 38 are in contact with the upper surface 3a of the base 3, and the wavelength conversion member 37 is not in contact with the upper surface 3a of the base 3 on any side. The transparent member 38 should be one that transmits the light from the semiconductor laser element 1. The transparent member 38 can be formed, for example, from glass, sapphire, or the like. In this embodiment, the transparent member 38 is formed from sapphire. The light emitting device 30 has substantially the same configuration as the light emitting device 10, except for the above configuration. Therefore, the light emitting device 30 has the same effect as the light emitting device 10.

What is claimed is:

1. A light emitting device, comprising:
    a support member having a base and a cap, the cap including a light extraction window from which light is extracted upward;
    a semiconductor laser element disposed within a space defined by the base and the cap;
    a light reflecting member disposed in the space at a position where light from the semiconductor laser element is reflected toward the light extraction window; and
    a wavelength conversion member disposed between the semiconductor laser element and the light reflecting member, the wavelength conversion member including a support surface, which supports the light reflecting member, and a light incidence surface on which the light emitted by the semiconductor laser element is incident,
    wherein part of the wavelength conversion member is fitted into the light extraction window, and
    the light reflecting member does not contact with an upper surface of the base of the support member on which the semiconductor laser element is mounted.

2. The light emitting device according to claim 1, further comprising
    a transmissive member covering the light extraction window, wherein
    the wavelength conversion member is fixed to the transmissive member.

3. The light emitting device according to claim 1, wherein an upper surface of the wavelength conversion member is at the same height as or lower than an upper end of the light extraction window.

4. The light emitting device according to claim 1, wherein the light reflecting member contacts with an inner side surface of the cap of the support member that is linked to the upper surface of the base of the support member.

5. The light emitting device according to claim 1, further comprising
    an antireflective film provided on the light incidence surface of the wavelength conversion member.

6. The light emitting device according to claim 1, wherein the base has an area of at least 10 mm$^2$ in a plan view.

7. The light emitting device according to claim 6, wherein the area of the base is 35 mm$^2$ or less.

8. The light emitting device according to claim 1, wherein a size of the light extraction window is from 0.3 mm$^2$ to 9 mm$^2$.

9. The light emitting device according to claim 1, wherein a size of the light extraction window is 5 to 20 times as large as a spot diameter of the light on the light incidence surface of the wavelength conversion member.

10. The light emitting device according to claim 1, wherein the light extraction window has a polygonal shape.

11. The light emitting device according to claim 1, wherein the semiconductor laser element has an oscillation wavelength in the range of 400 nm to 530 nm.

12. The light emitting device according to claim 1, further comprising
    a sub-mount disposed on the upper surface of the base, wherein the semiconductor laser element is disposed on an upper surface of the sub-mount.

13. The light emitting device according to claim 1, wherein the light reflecting member is a member having an inclined surface, or the light reflecting member has a member, which includes an inclined surface, and a reflective film provided on at least one surface of the member.

14. The light emitting device according to claim 13, wherein the member has a triangular prism shape, a quadrangular prism shape, a truncated triangular pyramidal shape, or a truncated square pyramidal shape.

15. The light emitting device according to claim 1, wherein the light reflecting member has a reflective surface reflecting the light from the semiconductor laser element, and the reflective surface is disposed intersecting an optical axis of the light at 30 to 60 degrees.

16. The light emitting device according to claim 1, wherein the wavelength conversion member is a single crystal of a phosphor, a sintered phosphor, or a sinter of a phosphor and a ceramic.

17. The light emitting device according to claim 1, wherein the wavelength conversion member is a mixture of a phosphor and a ceramic with a proportion of the phosphor of 50 wt % or less with respect to a total weight of the wavelength conversion member.

18. The light emitting device according to claim 1, wherein the wavelength conversion member is integrated with the light reflecting member in the form of a polygonal prism or a truncated polygonal pyramid.

19. The light emitting device according to claim 1, wherein an entire surface of the support surface of the wavelength conversion member is connected to the light reflecting member.

* * * * *